United States Patent [19]

Aoyama et al.

[11] Patent Number: 5,174,816
[45] Date of Patent: Dec. 29, 1992

[54] SURFACE TREATING AGENT FOR ALUMINUM LINE PATTERN SUBSTRATE

[75] Inventors: Tetsuo Aoyama; Mayumi Takahashi; Toshio Kondo; Hideki Fukuda, all of Niigata, Japan

[73] Assignee: Mitsubishi Gas Chemical Company, Inc., Tokyo, Japan

[21] Appl. No.: 704,342

[22] Filed: May 23, 1991

[30] Foreign Application Priority Data

Jun. 14, 1990 [JP] Japan .................. 2-154005

[51] Int. Cl.$^5$ .............................................. L23F 1/36
[52] U.S. Cl. ..................................... 106/203; 106/162; 156/625; 156/665; 252/79.1; 127/29
[58] Field of Search ............... 106/203, 162; 156/625, 156/665; 252/79.1; 127/29

[56] References Cited

U.S. PATENT DOCUMENTS

| | | | |
|---|---|---|---|
| 3,715,250 | 2/1973 | Altman et al. | 106/665 |
| 4,339,340 | 7/1982 | Muraoka et al. | 156/665 |
| 4,888,090 | 12/1989 | Sheetz | 156/665 |

FOREIGN PATENT DOCUMENTS

| | | |
|---|---|---|
| 0253675 | 1/1988 | European Pat. Off. . |
| 52-64876 | 5/1977 | Japan . |
| 56-53211 | 12/1981 | Japan . |

OTHER PUBLICATIONS

Extended Abstracts, vol. 84, No. 2, Oct. 1989, pp. 500–501, P. C. Chang et al., "A Process to Prevent Corrosion After Reactive Ion Etch of Aluminum on TiW".

*Primary Examiner*—Theodore Morris
*Assistant Examiner*—David M. Brunsman
*Attorney, Agent, or Firm*—Frishauf, Holtz, Goodman & Woodward

[57] ABSTRACT

A surface treating agent for an aluminum line pattern substrate is disclosed, comprising an aqueous solution containing 0.01 to 15% by weight of quaternary ammonium hydroxide represented by the general formula:

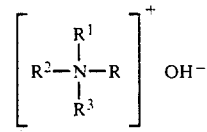

wherein R is an alkyl group having 1 to 3 carbon atoms, or a hydroxy-substituted alkyl group having 1 to 3 carbon atoms, and $R^1$, $R^2$ and $R^3$ are independently an alkyl group having 1 to 3 carbon atoms, and 0.1 to 20% by weight of sugar or sugar alcohol. This agent can inhibit the after-corrosion of aluminum effectively.

12 Claims, 2 Drawing Sheets

SURFACE TREATING AGENT FOR ALUMINUM LINE PATTERN SUBSTRATE

BACKGROUND OF THE INVENTION

1. Field of the Invention

The present invention relates to a surface treating agent for an aluminum line pattern substrate and more particularly to a surface treating agent comprising an aqueous solution of quaternary ammonium hydroxide and sugar or sugar alcohol, which prevents after-corrosion of an aluminum pattern on a semiconductor substrate, i.e., corrosion of the aluminum pattern due to chlorine.

2. Description of the Related Arts

Heretofore, aluminum has been widely used as a material to form an electrode or a line pattern on a semiconductor substrate. In etching for the formation of the electrode or the line pattern, wet etching method using an acid or an inorganic alkali as a main component is employed. In addition, an etching method using an aqueous organic alkali solution, such as an aqueous solution of trimethyl(2-hydroxyethyl)ammonium hydroxide or an aqueous solution of tetramethylammonium hydroxide, is known (for example, Japanese Patent Publication Nos. 41529/1980 and 53211/1981, and Japanese Patent Application Laid-Open No. 161929/1980). However, etching for the formation of a pattern which is greatly increased in fineness is difficult to attain by the wet etching method, and in the case of the aqueous organic alkali solution, a rate of etching is too fast. For these reasons, in an etching process for the formation of a fine pattern, not the wet etching method but a dry etching method has been mainly employed in recent years. In this dry etching method, chlorine is mainly used as a chemical. This chlorine, however, causes the problem that it remains in a pattern substrate after etching and reacts with moisture in the air to thereby form a chlorine compound such as hydrochloric acid, which reacts with aluminum to cause corrosion of the aluminum (which is called "after-corrosion") and thus to reduce the fidelity of the semiconductor itself. In order to avoid the problem of aluminum corrosion due to the residual chlorine, various attempts have been made. For example, (1) a method in which after etching, the aluminum pattern substrate is heated to remove the residual chlorine, (2) a method in which after etching, heated nitrogen gas is blown onto the aluminum pattern substrate to remove the residual chloride, and (3) a method in which after etching, the aluminum pattern substrate is rinsed with pure water are proposed. In accordance with these methods, however, it is difficult to completely remove the chlorine remaining on the aluminum pattern substrate. In addition, (4) a method is known in which after etching, the aluminum pattern substrate is treated with fluorine- or oxygen-based plasma gas to form a passivation film on the surface of the aluminum pattern substrate, so that the surface of the aluminum pattern substrate is prevented from coming into contact with moisture and the aluminum corrosion is avoided. This method, however, fails to completely remove the chlorine responsible for the corrosion although the surface of the aluminum pattern substrate can be prevented from coming into contact with moisture. In a long term, therefore, it is not possible to completely prevent the formation of corrosion due to chlorine; it has been desired to completely remove the residual chlorine.

In view of these circumstances, the present inventors made extensive investigations on a treating solution for the aluminum pattern substrate after dry etching using chlorine. Since it is known that chlorine or chlorine compounds can be removed by treating with an alkali, it was attempted to use an aqueous organic alkali solution as described above, which has heretofore been used as an etching agent, for the purpose of removing chlorine. It has been found, however, that the aqueous organic alkali solution cannot be used for removal of the residual chlorine as it is, because it causes vigorous etching of aluminum.

As a result of further investigations, it has been found that an aqueous solution prepared by compounding sugar or sugar alcohol to an aqueous organic alkali solution containing a quaternary ammonium hydroxide represented by the general formula as described hereafter is very effective in preventing the etching of aluminum and in removing chlorine and other impurities.

SUMMARY OF THE INVENTION

An object of the present invention is to provide a treating agent which is capable of completely removing chlorine remaining on the surface of an aluminum line pattern substrate after dry etching, and of preventing the etching of aluminum, particularly the formation of after-corrosion.

The present invention relates to a surface treating agent for an aluminum line pattern substrate, comprising an aqueous solution containing 0.01 to 15% by weight of a quaternary ammonium hydroxide represented by the general formula as described hereinafter, and 0.1 to 20% by weight of sugar or sugar alcohol.

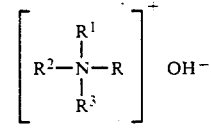

wherein R is an alkyl group having 1 to 3 carbon atoms, or a hydroxy-substituted alkyl group having 1 to 3 carbon atoms, and $R^1$, $R^2$ and $R^3$ are independently an alkyl group having 1 to 3 carbon atoms.

DETAILED DESCRIPTION OF THE INVENTION

Figure 1:
FIG. 1 is a schematic view ($\times$ about $5 \times 10^3$) of an electron micrograph illustrating the surface state of an aluminum line pattern substrate treated with a surface treating agent of the present invention.

The quaternary ammonium hydroxide of the above general formula includes tetraalkylammoniumhydroxide in which the alkyl group has 1 to 3 carbon atoms, and trialkyl(hydroxyalkyl)ammoniumhydroxide in which R is a hydroxy-substituted alkyl group. Specific examples are tetramethylammoniumhydroxide, tetraethylammoniumhydroxide, tetrapropylammoniumhydroxide, trimethylethylammoniumhydroxide, trimethyl(2-hydroxyethyl)ammoniumhydroxide, triethyl(2-hydroxyethyl) ammoniumhydroxide, tripropyl(2-hydroxyethyl)ammoniumhydroxide and trimethyl(1-hydroxypropyl)ammoniumhydroxide. Of these compounds, tetramethylammoniumhydroxide (hereinafter referred to as "TMAH") and trimethyl(2-hydroxyethyl)-ammoniumhydroxide (hereinafter referred to as "chloline") are particularly suitable.

The quaternary ammonium hydroxide is used in a concentration of 0.01 to 15% by weight, preferably 0.05 to 10% by weight based on the weight of the total solution. If the concentration of the quaternary ammonium hydroxide is too low, the desired effects cannot be obtained, and if the concentration is too high, etching of aluminum itself undesirably proceeds.

The sugar to be used in combination with the above quaternary ammonium hydroxide includes saccharides such as monosaccharide and polysaccharide. Specific examples are glyceric aldehyde having 3 to 6 carbon atoms, threose, erythrose, arabinose, xylose, ribose, ribulose, xylulose, glucose, mannose, galactose, tagatose, allose, aldose, gulose, idose, talose, sorbose, psicose, and fruit sugar. Specific examples of the sugar alcohol are threitol, erythritol, adonitol, arabitol, xylitol, talitol, sorbitol, mannitol, iditol, and dulcitol. Of these compounds, saccharides such as glucose, mannose and galactose, and sugar alcohols such as sorbitol, mannitol and xylitol are suitable from viewpoints of solubility or dispersibility, and so forth.

The sugar or sugar alcohol is used in a concentration of 0.1 to 20% by weight, preferably 0.5 to 15% by weight of the total solution. If the concentration of the sugar or sugar alcohol is lower than the above range, etching of aluminum cannot be prevented sufficiently. On the other hand, if the concentration is higher than the above range, use of the sugar or sugar alcohol in such high concentrations is undesirable from an economical standpoint.

Treatment of the aluminum line pattern substrate with the surface treating agent of the present invention is generally carried out by a dipping method. In addition, other methods such as spraying can be employed.

In the treatment of the aluminum line pattern substrate with the surface treating agent of the present invention, the desired effects can usually be attained sufficiently at ordinary temperature, but if necessary, heat or supersonic waves may be applied in combination.

The present invention is described in greater detail with reference to the following examples.

EXAMPLE 1

A 3 inch silicon wafer was placed in a sputtering apparatus, Model SH-550 produced by Ulvac Co., and aluminum was provided thereon in a thickness of about 1 μm by sputtering to produce a test wafer (A). This test wafer (A) was measured for aluminum etching rate at 25° C. by the use of an aqueous solution containing 2.4 wt % of TMAH, and aqueous solutions prepared by adding 1 wt %, 2 wt %, 3 wt % and 5 wt % of sorbitol to the aqueous solution containing 2.4 wt % of TMAH, respectively. The results are shown in Table 1.

TABLE 1

| TMAH Concentration (wt %) | Sorbitol Concentration (wt %) | Aluminum Etching Rate (Å) |
|---|---|---|
| 2.4 | — | 500 |
| 2.4 | 1 | 210 |
| 2.4 | 2 | 150 |
| 2.4 | 3 | 100 |
| 2.4 | 5 | 70 |

From the above results, it can be seen that addition of sorbitol, one of the sugar alcohols, markedly retards the aluminum etching rate.

EXAMPLE 2

The test wafer (A) of Example 1 was measured for aluminum etching rate at 25° C. by the use of aqueous solutions of TMAH and various sugars, sugar alcohols or polyhydric alcohols. The results are shown in Table 2.

TABLE 2

| TMAH Concentration (wt %) | Sugar, Sugar Alcohol, or Polyhydric Alcohol | Amount (wt %) | Aluminum Etching Rate (Å/min) |
|---|---|---|---|
| 2.4 | Xylitol | 3.0 | 85 |
| 0.6 | Xylitol | 3.0 | 70 |
| 2.4 | Mannose | 3.0 | 115 |
| 2.4 | Glucose | 3.0 | 135 |
| 2.4 | Mannitol | 3.0 | 150 |
| 4.0 | Xylitol | 1.0 | 280 |
| 2.4 | Glycerol | 3.0 | 490 |
| 2.4 | Tetraethylene glycol | 3.0 | 505 |

From the above results, it can be seen that addition of the sugar or sugar alcohol sufficiently retards the etching while the polyhydric alcohol such as glycerol and tetraethylene glycol is not effective at all in preventing the aluminum etching.

EXAMPLE 3

The test wafer (A) of Example 1 was measured for aluminum etching rate at 25° C. using choline in place of TMAH of Example 1. As shown in Table 3 below, results similar to those of TMAH were obtained.

TABLE 3

| Choline Concentration (wt %) | Sorbitol Concentration (wt %) | Aluminum Etching Rate (Å/min) |
|---|---|---|
| 2.4 | — | 440 |
| 2.4 | 1 | 185 |
| 2.4 | 2 | 130 |
| 2.4 | 3 | 85 |
| 2.4 | 5 | 60 |

EXAMPLE 4

The wafer (A) produced in Example 1 was spin coated with a positive type photoresist, OFPR-800 produced by Tokyo Ohka Co., Ltd., at 3,000 rpm, prebaked at 80° C. for 10 minutes, and then subjected to contact light exposure.

After the contact light exposure, post baking was conducted at 120° C. for 30 minutes, and then development was conducted using a positive type resist developer, ELM-D (containing 2.38 wt % of TMAH) produced by Mitsubishi Gas Chemical Co., Inc., to form a 1 μm line and space pattern. This was placed on an RIE apparatus, Model ILD-4015, produced by Nichiden Anerba Co., Ltd., and the aluminum was subjected to dry etching with chlorine gas. Moreover, in an ashing apparatus, Model TA100 S, produced by Tokyo Electro Co., Ltd., it was subjected to ozone ashing to form a test wafer (B).

This test wafer (B) was dipped in an aqueous solution containing 2.4 wt % of TMAH and 3 wt % of sorbitol, at 25° C. for 1 minute, rinsed with water, rinsed with isopropanol, and then dried.

After the test wafer (B) was allowed to stand at room temperature for 5 hours, the surface was examined under an electron microscope produced by JEOL Corp. The after-corrosion of the aluminum was not observed at all, and the vigorous etching of the aluminum line pattern was not almost observed.

FIG. 1 is a schematic view of an electron micrograph illustrating the surface state.

COMPARATIVE EXAMPLE 1

The test wafer (B) produced in Example 4 was rinsed with water, rinsed with isopropanol without being dipped in an aqueous solution containing 2.4 wt % of TMAH and 3 wt % of sorbitol, and then dried. After the test wafer (B) was allowed to stand at room temperature in the atmosphere, the surface was examined under an electron microscope produced by JEOL Corp. A lot of after-corrosion of the aluminum was observed, and it was also observed that the aluminum line pattern was cut at several points.

Figure 2:
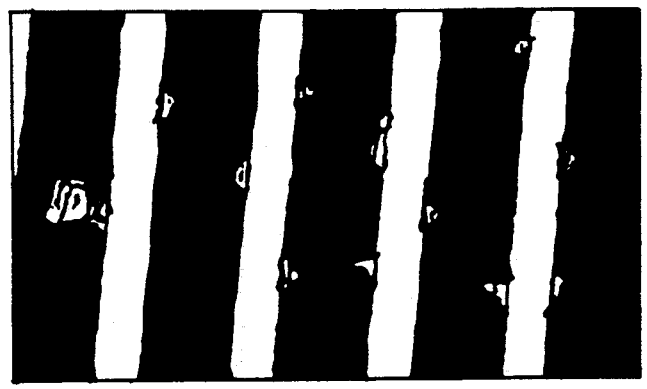
FIG. 2 is a schematic view of an electron micrograph illustrating the surface state of an aluminum line pattern substrate not treated with a surface treating agent of the present invention.

FIG. 2 is a schematic view of an electron micrograph illustrating the surface state.

COMPARATIVE EXAMPLE 2

The test wafer (B) produced in Example 4 was soaked in an aqueous solution containing 2.4 wt % of TMAH at 25° C. for 1 minute, rinsed with water, rinsed with isopropanol, and then dried. After the test wafer (B) was allowed to stand at room temperature for 5 hours, the surface was examined under an electron microscope produced by JEOL Corp. Although the aluminum after-corrosion was not observed, the aluminum line pattern was vigorously etched and was decreased in width at several points, and moreover the surface of the aluminum line pattern was etched, resulting in loss of smoothness.

Figure 3:
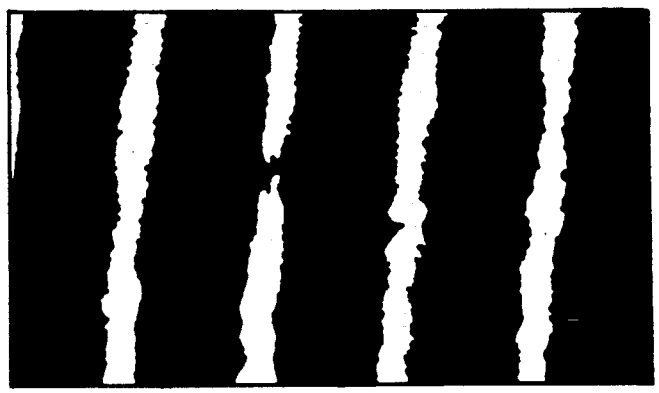
FIG. 3 is a schematic view of an electron micrograph illustrating the state of an aluminum line pattern substrate when the substrate is subjected to surface treatment with an aqueous solution of tetramethylammoniumhydroxide as an organic alkali.

FIG. 3 is a schematic view of an electron micrograph illustrating the surface state.

What is claimed is:

1. A surface treating agent for an aluminium line pattern substrate, comprising an aqueous solution comprising
    (a) 0.01 to 15% by weight of a quaternary ammonium hydroxide of the formula:

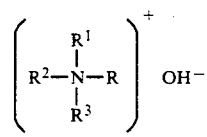

wherein R is an alkyl group having 1 to 3 carbon atoms, or a hydroxy-substituted alkyl group having 1 to carbon atoms, and $R^1$, $R^2$, and $R^3$ are independently an alkyl group having 1 to 3 carbon atoms, and
    (b) 0.1 to 20% by weight of at least one sugar or sugar alcohol selected from the group consisting of a glyceric aldehyde having 3 to 6 carbon atoms, threose, erythrose, arabinose, xylose, ribose, ribulose, xylulose, glucose, mannose, galactose, tagatose, allose, aldose, gulose, idose, talose, sorbose, psicose, fruit sugar, threitol, erythritol, adonitol, arabitol, xylitol, talitol, sorbitol, mannitol, iditol and dulcitol.

2. The surface treating agent as claimed in claim 1, wherein the quaternary ammonium hydroxide is at least one member selected from the group consisting of tetramethylammonium hydroxide, tetraethylammonium hydroxide, tetrapropylammonium hydroxide, trimethylethylammonium hydroxide, trimethyl(2-hydroxyethyl)ammonium hydroxide, triethyl(2-hydroxyethyl)ammonium hydroxide, tripropyl(2-hydroxyethyl)ammonium hydroxide and trimethyl(1-hydroxypropyl)ammonium hydroxide.

3. The surface treating agent as claimed in claim 1, wherein the quaternary ammonium hydroxide is selected from the group consisting of tetramethylammonium hydroxide and trimethyl(2-hydroxyethyl) ammonium hydroxide.

4. The surface treating agent as claimed in claim 1, wherein the sugar or sugar alcohol is at least one member selected from the group consisting of glucose, mannose, galactose, sorbitol, mannitol and xylitol.

5. The surface treating agent as claimed in claim 1, wherein the aqueous solution comprises 0.05 to 10% by weight of the quaternary ammonium hydroxide and 0.5 to 15% by weight of the sugar or sugar alcohol.

6. The surface treating agent as claimed in claim 5, wherein the quaternary ammonium hydroxide is selected from the group consisting of tetramethylammonium hydroxide and trimethyl(2-hydroxyethyl)ammonium hydroxide.

7. The surface treating agent as claimed in claim 6, wherein the sugar or sugar alcohol is selected from the group consisting of glucose, mannose, galactose, sorbitol, mannitol and xylitol.

8. The surface treating agent as claimed in claim 5, wherein the sugar or sugar alcohol is selected from the group consisting of glucose, mannose, galactose, sorbitol, mannitol and xylitol.

9. The surface treating agent as claimed in claim 5 wherein the sugar is glucose and the quaternary ammonium hydroxide is selected from the group consisting of tetramethylammonium hydroxide and trimethyl(2-hydroxyethyl)ammonium hydroxide.

10. The surface treating agent as claimed in claim 5, wherein the sugar alcohol is sorbitol and the quaternary ammonium hydroxide is selected from the group consisting of tetramethylammonium hydroxide and trimethyl(2-hydroxyethyl)ammonium hydroxide.

11. The surface treating agent as claimed in claim 1, wherein the sugar is glucose and the quaternary ammonium hydroxide is selected from the group consisting of tetramethylammonium hydroxide and trimethyl(2-hydroxyethy/trimethyl)ammonium hydroxide.

12. The surface treating agent as claimed in claim 1, wherein the sugar alcohol is sorbitol and the quaternary ammonium hydroxide is selected from the group consisting of

* * * * *